United States Patent [19]

Iijima et al.

[11] Patent Number: 4,987,414
[45] Date of Patent: Jan. 22, 1991

[54] SIGNAL PROCESSING CIRCUIT FOR AN ENCODER

[75] Inventors: Kenzaburou Iijima; Yoshinori Hayashi, both of Shizuoka, Japan

[73] Assignee: Yamaha Corporation, Japan

[21] Appl. No.: 376,694

[22] Filed: Jul. 7, 1989

[30] Foreign Application Priority Data

Jul. 8, 1988 [JP] Japan .............................. 63-170599

[51] Int. Cl.$^5$ ............................................ H03M 1/22
[52] U.S. Cl. ........................................ 341/15; 364/561
[58] Field of Search ........................ 341/6, 15, 131, 13, 341/155, 156; 250/231 SE; 364/561; 324/173

[56] References Cited

U.S. PATENT DOCUMENTS 4,445,112 4/1984 Haville .................................. 341/13
4,811,254 3/1989 Iijima et al. ........................... 341/6

Primary Examiner—William M. Shoop, Jr.
Assistant Examiner—Brian K. Young
Attorney, Agent, or Firm—Ostrolenk, Faber, Gerb & Soffen

[57] ABSTRACT

In construction of a signal processing circuit for an encoder including a pair of phased magnetic sensors arranged, for relative displacement, facing a magnetized track on a scale, output signals issued by the magnetic sensors are first stage divided by an analog processing unit and, after conversion into digital signals, second stage conversion is carried out by a digital phase locked loop connected to the analog processing unit. The degree of dissolution in detection of the displacement by the entire circuit is remarkably enhanced by the dual stage division of the signals during processing.

7 Claims, 1 Drawing Sheet

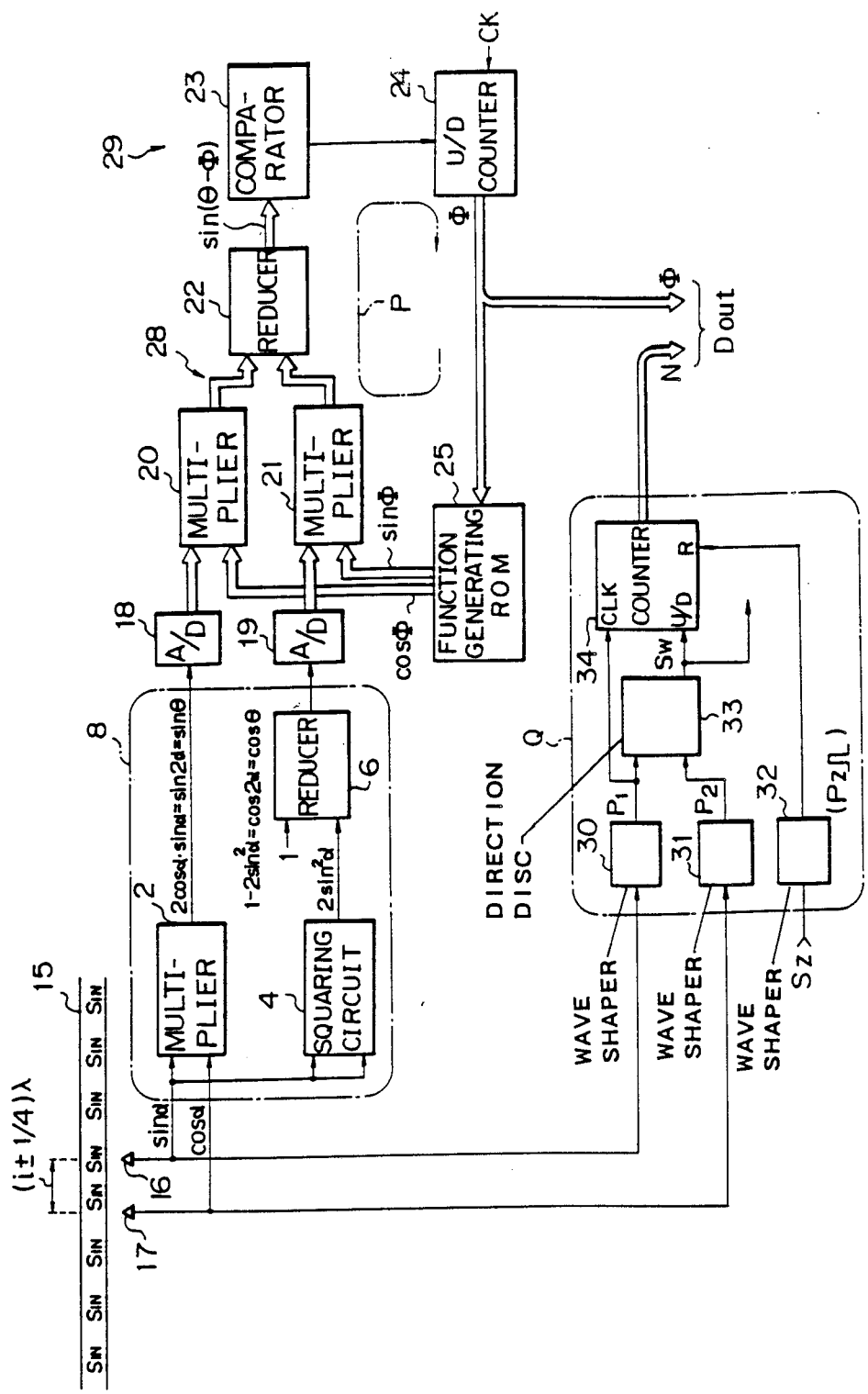

SIGNAL PROCESSING CIRCUIT FOR AN ENCODER

BACKGROUND OF THE INVENTION

The present invention relates to an improved signal processing circuit for an encoder, and more particularly relates to improvement in resolution of a signal processing circuit used for a magnetic or photoelectric encoder for detection of an angular or linear displacement of a mobile object.

A number of signal processing circuits have already been developed in the field of encoders used for the above-described purposes. One of the most typical conventional signal processing circuit is described in Japanese Patent Application Sho. No. 61-54288. This signal processing circuit is adapted for use in a magnetic rotary encoder. A scale is formed by a magnetic disc having a track formed on its periphery and the track is magnetized with a sine wave having a constant period. The wave length $\lambda$ of the sine wave used for the magnetization is preferably chosen in a range from several tens to several hundreds $\mu m$.

A pair of magnetic sensors are arranged in spaced relation to and facing the track on the scale to generate level signals corresponding to the intensity of magnetization of the scale. These magnetic sensors are made of a device which includes no carrier waves in its output signals. Most typically, a magnetic wafer or a semiconductor element is preferably used for the magnetic sensors. The magnetic sensors are arranged so that their output signals have a phase difference of $\frac{1}{4}\lambda$ (90°). In other words, the magnetic sensors are spaced apart from each other by a distance equal to $(i\pm\frac{1}{4}\lambda)$ in the longitudinal direction of the scale, when i is a positive integer. The magnetic sensors and the scale are arranged for relative displacement in a manner such that the magnetic sensors move around a fixed scale or the magnetic sensors are fixed about a rotatable scale.

As is clear from the foregoing, the second magnetic sensor issues a cosine wave signal when the first magnetic sensor issues a sine wave signal. As a consequence, when the length of one period of the sine wave used for magnetization is set to $\theta = 0$ to $2\pi$, the magnetic sensors issue analog signals $\sin \theta$ and $\cos \theta$.

The magnetic sensors are connected to respective A/D converters which convert the analog signals $\sin \theta$ and $\cos \theta$ to corresponding digital signals. The digitalized signals $\sin \theta$ and $\cos \theta$ are then applied to one input terminal of respective digital multipliers. The output signals of the multipliers are supplied to input terminals of a digital reducer whose output signal is applied to a digital comparator.

The comparator issues an up/down signal (U/D) which is applied to the up-down switch terminal U/D of the first counter. Here, the U/D signal assumes a value "1" when the result of reduction at the reducer exceeds 0 and a value "0" when the result does not exceeds 0. The counter counts clock signals CK periodically inputted thereto in a known manner. The counter operates in an up-count mode on receipt of a "1" signal and in a down-count mode on receipt of a "0" signal at its up-down switch terminal U/D.

A function generating ROM is interposed between the counter and the multipliers. This function generating ROM issues sine and cosine data corresponding to a count value $\phi$ at the counter. That is to say, data $\sin \phi$ and $\cos \phi$ data are prestored in the function generating ROM and, depending on the count value $\phi$ received from the counter, that data is sequentially read out. The data $\sin \phi$ and $\cos \phi$ data are supplied to the other input terminal of the digital multipliers.

With such a construction of the conventional signal processing circuit, one digital multiplier issues a signal $\sin \theta \cdot \cos \phi$ whereas the other multiplier issues a signal $\cos \theta \cdot \sin \phi$. As a result, the digital reducer issues a signal $\sin \theta \cdot \cos \phi - \cos \theta \cdot \sin \phi = \sin (\theta - \phi)$. On receipt of this output signal, the digital comparator makes the U/D signal equal to "1" for the positive value of the output signal and to "0" for the negative value of the output signal. The count value $\phi$ of the counter varies depending on the polarity of the signal $\sin (\theta - \phi)$. The digital multipliers and the function generating ROM in combination form a function generating unit. However, the comparator and the counter form in combination a counting unit.

The magnetic sensors are also connected to the first and second wave shaping circuits each of which discriminates the output signal from the associated magnetic sensor by means of a threshold value to convert into a 2 value signal of a "1" level and a "0" level. Output signals from the wave shaping circuits take the form of square waves which are out of phase relative to each other by $\pi/2$. When the relative displacement between the scale and the magnetic sensors is in a positive direction, the output signal from the first wave shaping circuit precedes in phase and, when negative, the output signal from the second wave shaping circuit precedes in phase.

The wave shaping circuits are connected to a common direction discriminator which detects the polarity of the relative displacement. Such discrimination is carried out, for example, depending on the level of the output signal from the first wave shaping circuit at the rising of the output signal from the second wave shaping circuit. The output signal from the direction discriminator is applied to the up-down terminal of a counter and to the outside of the system.

The counting mode of the counter is effected by the output signal from the direction discriminator and, at the same time, counts the pulses from one wave shaping circuit. The counter is operated in to an up-count mode for the positive direction of the above-described relative displacement and in a down-count mode for the negative direction of the relative displacement. Once every relative rotation between the magnetic sensors and the scale, a 0-point signal is issued at the reference position of the scale. After passing through the third wave shaping circuit, the 0-point signal is converted into a 0-point pulse which is then passed to the reset terminal of the second counter. As a result, the second counter is reset every time the magnetic sensor pass by the reference position on the scale. As a consequence, the count value of the second counter corresponds to the number of magnetic domains, which is equal to the number of magnetic poles, passed by the magnetic sensors in the area between their current position and the reference position. The first to third wave shaping circuits, the direction discriminator and the second counter thus form a scale domain counting unit.

With the above-described construction and function, the output signal N from the second counter forms the higher bit data of the displacement data Dout whereas the count value $\phi$ of the first counter from the lower bit data of the displacement data Dout.

As is clear from the foregoing description, the second counter counts up every time the magnetic sensors pass by one magnetic domain at the positive displacement between the magnetic sensors and the scale and the count values are supplied to the higher bits of the displacement data Dout. Thus the higher bits of the displacement data Dout indicates the number of the magnetic domains passed by the magnetic sensors, i.e. the current position of the magnetic sensors with respect to the reference position on the scale.

Further, after conversion by the A/D converters, the analog signals $\sin \theta$ and $\cos \theta$ from the magnetic sensors are respectively multiplied with the signals $\cos \phi$ and $\sin \phi$ issued by the function generating ROM. The result of multiplication is processed through the reducer to produce a signal $\sin (\theta - \phi)$. Depending upon the polarity of this signal, the comparator makes the U/D signal equal to "1" or "0" to vary the count value $\phi$ of the first counter. Depending upon the count value $\phi$, the output signal $\sin \phi$ and $\cos \phi$ from the function generating ROM vary. As a consequence, a sort of digital phase locked loop is formed by the multipliers, the reducer, the comparator, the first counter, the function generating ROM and the multipliers.

The above-described digital phase locked loop operates so that the value of $\sin (\theta - \phi)$ should always be equal to 0, i.e. $\theta$ should always be equal to $\phi$. Thus the count value $\phi$ of the first counter indicates the position of the magnetic sensors within a certain magnetic domain. When the first counter is provided with 8 to 10 bits, the value $\theta$ in a range form 0 to $2\pi$ is divided into 256 to 2048 fractions. In other words, the degree of resolution in detection by the count value $\phi$ has a precision of 1/256 to 1/2048 of a magnetic domain.

In the case of signal processing by the above-described signal processing circuit, the analog signals $\sin \theta$ and $\cos \theta$ issued by the magnetic sensors are first converted into corresponding digital signals, and the common value $\theta$ is then divided finely by the digital phase locked loop and the divided data, i.e. the count values $\phi$ are issued as the displacement data. In order to raise the resolution in detection under this condition, one possible expedient is to increase the number of bits at the first counter to raise the dividing function of the digital phase locked loop. For various economic and technological reasons, however, there is a certain limit to increasing the bit number at the first counter.

Since the displacement data are given in the form of digital signals, transfer of the data to an analog control circuit or the like requires use of a D/A converter, which inevitably raises installation costs and increases processing time.

SUMMARY OF THE INVENTION

It is the main object of the present invention to provide a signal processing circuit for an encoder having high degree of resolution in detection without any virtual increase in cost.

It is the other object of the present invention to provide a signal processing circuit for an encoder whose output signals can be directly transferred to other analog circuits without any additional signal treatment.

In accordance with the basic concept of the present invention, output signals from magnetic sensors are divided by analog signal processing and the divided signals are further finely divided by digital signal processing.

BRIEF DESCRIPTION OF THE DRAWING

The attached drawing is a circuit diagram of one embodiment of the signal processing circuit in accordance with the present invention.

DESCRIPTION OF THE PREFERRED EMBODIMENTS

The construction of one embodiment of the signal processing circuit is shown in the attached drawing, in which the circuit includes a digital phase locked loop P and a scale domain counting unit Q as in the conventional signal processing circuit. In addition to these elements, the circuit further includes an analog processing unit 8 which forms the heart of the present invention. This analog processing unit 8 is interposed between a pair of magnetic sensors 16 and 17 facing a disc type scale 15 and the digital phase locked unit P.

The digital phase locked loop P and the domain counting unit Q are substantially same in construction and operation as those in the above-described conventional signal processing unit. Briefly, a sine wave is magnetized along a circular track on the periphery of the scale 15 with a period of $\alpha = 0$ to $2\pi$ and the magnetic sensors 16 and 17 issue an analog sine wave signal $\sin \alpha$ and an analog cosine wave signal $\cos \alpha$, respectively.

The digital phase locked loop P includes a pair of A/D converters 18 and 19 connected to the magnetic sensors 16 and 17, respectively, via the analog processing unit 8, a pair of multipliers 20 and 21 connected to the A/D converters 18 and 19, respectively, a comparator 23 connected to the multipliers 20 and 21 via a reducer 22, a first counter 24 connected to the comparator 23 and a function generating ROM 25 interposed between the first counter 24 and the multipliers 20 and 21. The reducer issues a signal $\sin (\theta - \phi)$ and the first counter issues count values $\phi$ which form the lower bits of displacement data Dout. The function generating ROM 25 issues signals $\cos \phi$ and $\sin \phi$ which are passed to the multipliers 20 and 21.

The domain counting unit Q includes the first and second wave shaping circuits 30 and 31 connected to the magnetic sensors 16 and 17, respectively, the third wave shaping circuit 32 receptive of 0-point signals issued every time the reference position on the scale 15 is passed by the magnetic sensors 16 and 17, a direction discriminator 33 connected to the first and second wave shaping circuits 30 and 31, and the second counter 34 connected to the first to third wave shaping circuits 30 to 32. The second counter 34 issues count values N which form the higher bits of the displacement data Dout.

The analog processing unit 8 includes a multiplier 2 connected on its input side to the magnetic sensors 16 and 17 and, on its output side, to A/D converter 18. The analog processing circuit 8 further includes a squaring circuit 4 connected on its input side to magnetic sensor 16 and, on its output side, to a reducer 6 which is in turn connected on its output side to the A/D converter 19.

The multiplier 2 multiplies output signals $\sin \alpha$ and $\cos \alpha$ issued by the magnetic sensors 16 and 17 with each other to obtain a double value $2\cos\alpha \cdot \sin\alpha$ as follows;

$$2\cos\alpha \cdot \sin\alpha = \sin 2\alpha \quad (1)$$

From the above-described relationship, the output signals from the magnetic sensors 16 and 17 are converted into an analog sine wave signal sin 2α of a double frequency. This sine wave signal sin 2α is supplied to the A/D converter 18 as an analog sine wave signal sin θ.

The squaring circuit 4 squares the analog sine wave signal sin α issued by the magnetic sensor 16 to obtain a double value 2sin²α. The reducer 6 (a subtractor) reduces the squaring result from a constant value 1 as follows;

$$1 - \sin^2\alpha = \cos 2\alpha \qquad (2)$$

From the above-described relationship, the output signal from the magnetic sensor 16 is converted into an analog cosine wave signal cos 2α of a double frequency. This cosine wave signal cos 2α is supplied to the A/D converter 19 as an analog cosine wave signal cos θ.

It is well known that sine and cosine functions are expanded to n-times frequencies functions in general as follows, respectively, where n is an integer more than 2;

for "n" of an odd number $$\sin n\alpha = n\sin\alpha - n(n^2 - 1)/3!\sin^3\alpha + \qquad (3)$$
$$n(n^2 - 1)(n^2 - 3^2)/5!\sin^5\alpha \ldots$$

for "n" of an even number $$\sin n\alpha = n\cos\alpha\{\sin\alpha - (n^2 - 2^2)/3!\sin^3\alpha + \qquad (4)$$
$$(n^2 - 2^2)(n^2 - 4^2)/5!\sin^5\alpha \ldots\}$$

for "n" of an odd number $$\cos n\alpha = \cos\alpha\{1 - (n^2 - 1)/2!\sin^2\alpha + (n^2 - 1)(n^2 - 3^2)/ \qquad (5)$$
$$4!\sin^4\alpha - (n^2 - 1)(n^2 - 3^2)(n^2 - 5^2)/6!\sin^6\alpha \ldots\}$$

for "n" of an even number $$\cos n\alpha = 1 - n^2/2!\sin^2\alpha + \qquad (6)$$
$$n^2(n^2 - 2^2)/4!\sin^4\alpha - n^2(n^2 - 2^2)(n^2 - 4^2)/6!\sin^6\alpha \ldots$$

When "n" is 2 in the foregoing equations, the following relationships are obtained;

$$\sin 2\alpha = 2\cos\alpha \cdot \sin\alpha \qquad (7)$$

$$\cos 2\alpha = 1 - 2\sin^2\alpha \qquad (8)$$

In combination with multipliers, adders and reducers, a desired analog processing circuit for the unit 8 can be obtained generally. The following "Table" shows the relationship between "sine and cosine functions" and "Analog Processing Circuit", when an integer "n" of the foregoing general equations varies from 2 to 5. Even if "n" is larger than 5, similar analog processing circuits can be obtained by the above combination method.

TABLE

| n | Sine and cosine functions | Analog Processing Circuit |
|---|---|---|
| n = 2 | $\sin 2\alpha = 2\cos\alpha \cdot \sin\alpha$<br>$\cos 2\alpha = 1 - \sin^2\alpha$ | sinα, cosα → multiplier → cosα·sinα → X2 → 2 cosα·sinα = sin 2α<br>→ multiplier → sin²α → X2 → 1 − → 1 − 2 sin²α = cos 2α |
| n = 3 | $\sin 3\alpha = -4\sin^3\alpha + 3\sin\alpha$<br>$\cos 3\alpha = 4\cos^3\alpha - 3\cos\alpha$ | sinα → multiplier → sin³α → X4 → 4 sin³α → − → −4 sin³α + 3 sinα = sin 3α<br>→ X3 → 3 sinα<br>cosα → multiplier → cos³α → X3 → 3 cosα; → X4 → 4 cos³α → − → 4 cos³α − 3 cosα = cos 3α |
| n = 4 | $\sin 4\alpha = -8\sin^3\alpha\cos\alpha + 4\sin\alpha\cos\alpha$<br>$\cos 4\alpha = 8\cos^4\alpha - 8\cos^2\alpha + 1$ | sinα → multiplier → sin³α → X8 → 8 sin³α → − → 4 sinα − 8 sinα → multiplier → sin 4α<br>→ X4 → 4 sinα, cosα<br>cosα → multiplier → cos²α, sin²α → multiplier → cos²α sin²α → X8 → 8 cos²α sin²α → 1 − → cos 4α |

TABLE-continued

| n | Sine and cosine functions | Analog Processing Circuit |
|---|---|---|
| n = 5 | $\sin 5\alpha = 16 \sin^5\alpha - 20 \sin^3\alpha + 5 \sin\alpha$<br>$\cos 5\alpha = 16 \cos^5\alpha - 20 \cos^3\alpha + 5 \cos\alpha$ | 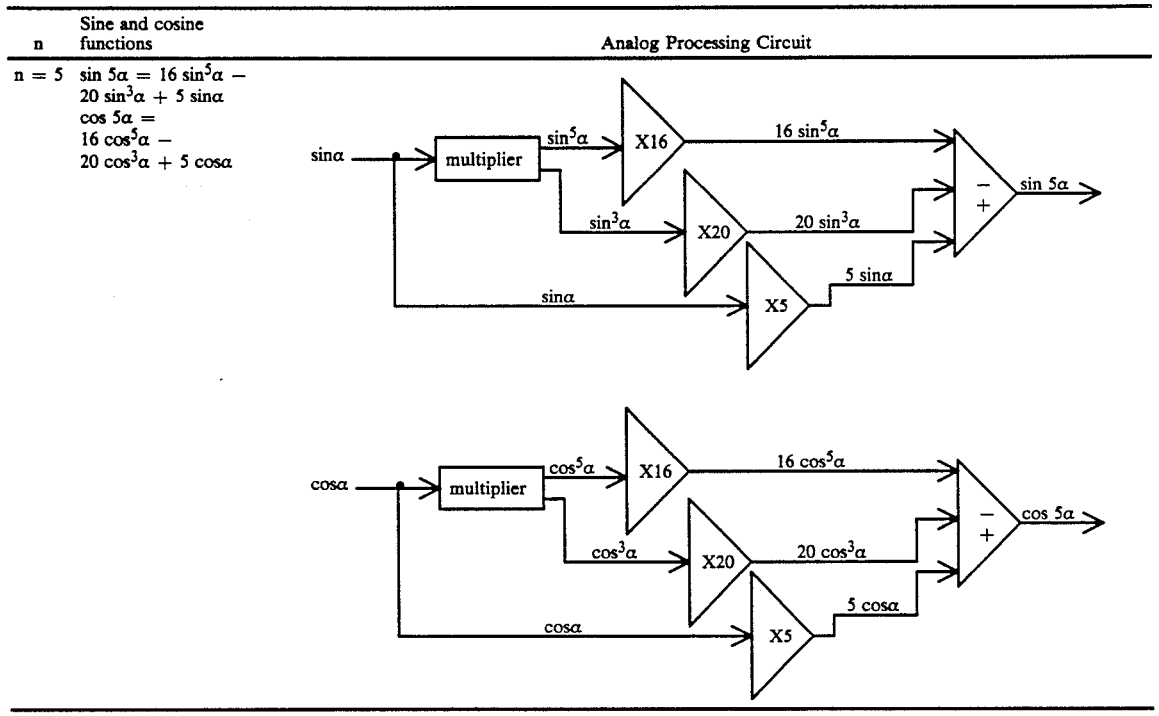 |

As a result of the above-described processing, the analog sine and cosine wave signals sin $\alpha$ and cos $\alpha$ issued by the magnetic sensors 16 and 17 are converted into double frequency analog sine and cosine wave signals sin $\theta$ (=sin 2$\alpha$) and cos $\theta$ (=cos 2$\alpha$) and, as a consequence, the value $\alpha$ is effectively divided into two fractions. After such division by the analog processing unit, the sine and cosine wave signals sin $\theta$ and cos $\theta$ are converted into corresponding digital signals by the A/D converters 18 and 19 for further processing through the digital phase locked loop P. That is, these digital signals are further divided finely in accordance with the number of bits at the first counter 24. As a result, it easily be well understood that the resultant degree of resolution of the entire circuit is double of that expected for the conventional signal processing circuit.

Because the sine and cosine wave signals sin $\theta$ and cos $\theta$ are issued by the analog processing unit 8 in the form of analog signals, these signals can be supplied directly to other analog processing circuits such as an analog control circuit. Further, by combining m sets of analog processing units 8, it is possible to obtain a $2^m$ times higher degree of dissolution in detection.

A significantly compact construction can be obtained when the analog processing unit 8, the A/D converters 18 and 19, the multipliers 20 and 21, the reducer 22, the comparator 23, the first counter 24 and the function generating ROM 25 are arranged on a single semiconductor base board.

In the case of the above-described embodiment, the signal processing circuit of the present invention is used for detection of relative displacement between the magnetic sensors and the circular scale. However, the circuit is of course usable for detection on a linear scale, i.e. for a rotary encoder.

In accordance with the present invention, the first stage signal division is performed by the analog processing unit, the second stage signal division is performed by the digital phase locked loop and such dual stage signal division significantly raises the degree resolution in detection of the entire signal processing circuit.

We claim

1. A signal processing circuit for an encoder, comprising:
   first and second magnetic sensors arranged facing a magnetized track on a scale to issue, in response to relative movement between said scale and said magnetic sensors, original analog sine and cosine wave signals representative of a magnetized pattern on said track;
   an analog processing unit connected to said first and second magnetic sensors to issue, as a function of said original analog sine and cosine wave signals, converted analog sine and cosine wave signals of n-times a basic frequency associated with said original analog sine and cosine wave signals, wherein n is an integer greater than 1;
   first and second A/D converters connected to said analog processing unit for converting said converted analog sine and cosine wave signals into corresponding digital output signals;
   a function generating ROM for issuing cosine and sine values of given prescribed data;
   first and second multipliers connected, at input sides thereof, to said first and second A/D converters and to said function generating ROM and being effective to issue a first output comprising a first product of said digital output signal from said first A/D converter and said cosine value from said function generating ROM, and a second output comprising a second product of said digital output signal from said second A/D converter and said sine value from said function generating ROM;

a first reducer connected to said first and second multipliers for providing a difference between said first and second products; and a counter connected to said first reducer, via a comparator, for counting differences issued by said first reducer in a mode depending upon the polarity of said differences to issue a count value for being supplied to said function generating ROM;

said first and second multipliers, said function generating ROM and said counter forming a digital phase locked loop and issuing said count value as displacement data.

2. A signal processing circuit for an encoder, comprising:

first and second magnetic sensors arranged facing a magnetized track on a scale to issue, in response to relative movement between said scale and said magnetic sensors, original analog sine and cosine wave signals representative of a magnetized pattern on said track;

an analog processing unit connected to said first and second magnetic sensors to issue, as a function of said original analog sine and cosine wave signals, converted analog sine and cosine wave signals of n-times a basic frequency associated with said original analog sine and cosine wave signals, wherein n is an integer greater than 1;

first and second A/D converters connected to said analog processing unit for converting said converted analog sine and cosine wave signals into corresponding digital output signals;

a function generating ROM for issuing cosine and sine values of given prescribed data;

first and second multipliers connected, at input sides thereof, to said first and second A/D converters and to said function generating ROM and being effective to issue a first output comprising a first product of said digital output signal from said first A/D converter and said cosine value from said function generating ROM, and a second output comprising a second product of said digital output signal from said second A/D converter and said sine value from said function generating ROM;

a first reducer connected to said first and second multipliers for providing a difference between said first and second products; and a counter connected to said first reducer, via said first reducer, for counting differences issued by said first reducer in a mode depending upon the polarity of said differences to issue a count value supplied to said function generating ROM;

said first and second multipliers, said function generating ROM and said counter forming a digital phase locked loop which issue said count value as displacement data;

said analog processing unit including a third multiplier interposed between said first and second magnetic sensors, a squaring circuit connected to said first magnetic sensor, and a second reducer connected to said squaring circuit.

3. A signal processing circuit as claimed in claim 1 in which said analog processing unit, said first and second A/D converters, said multipliers, said function generating ROM, said reducing circuit and said counter are arranged on a single semiconductor base board.

4. The signal processing circuit as claimed in claim 2, in which said analog processing unit, said first and second A/D converters, said multipliers, said function generating ROM, said first and second reducers and said counter are arranged on a single semiconductor base board.

5. The signal processing circuit of claim 1, further comprising means for generating said converted analog sine and cosine wave signals by using said original sine and cosine wave signals to generate therefrom said converted signals as an expanded trigonometric function of said converted wave signals.

6. The signal processing circuit of claim 1 wherein said analog processing unit is effective to carry out an n power production of said input signal frequencies.

7. The signal processing circuit of claim 6, further comprising means for generating said converted analog sine and cosine wave signals by using said original sine and cosine wave signals to generate therefrom said converted signals as an expanded trigonometric function of said converted wave signals.

* * * * *